United States Patent [19]

Salbreux

[11] Patent Number: 5,796,123
[45] Date of Patent: Aug. 18, 1998

[54] SEMICONDUCTOR COMPONENT MOUNTED BY BRAZING

[75] Inventor: Jean-Claude Salbreux, Saint Cyr sur Loire, France

[73] Assignee: SGS-Thomson Microelectronics S.A., Saint Genis, France

[21] Appl. No.: 755,196

[22] Filed: Nov. 25, 1996

[30] Foreign Application Priority Data

Nov. 30, 1995 [FR] France ............... 95 14382

[51] Int. Cl.$^6$ .............. H01L 29/87; H01L 23/13; H01L 29/60; H01L 23/50
[52] U.S. Cl. ............ 257/110; 257/109; 257/678; 257/689; 257/724
[58] Field of Search ................. 257/678, 110, 257/779, 724, 727, 689, 169

[56] References Cited

U.S. PATENT DOCUMENTS

| | | | |
|---|---|---|---|
| 3,701,914 | 10/1972 | Amelio et al. | 252/444 |
| 3,988,765 | 10/1976 | Pikor | 257/623 |
| 4,402,004 | 8/1983 | Iwosaki | 257/689 |
| 4,599,636 | 7/1986 | Roberts et al. | 257/724 |
| 4,914,045 | 4/1990 | Webb et al. | 257/734 |
| 4,935,803 | 6/1990 | Kulfus et al. | 257/779 |
| 4,963,976 | 10/1990 | Fluegel et al. | 257/689 |
| 5,001,545 | 3/1991 | Kalfus, et al. | 257/773 |
| 5,031,016 | 7/1991 | Jaecklin et al. | 257/689 |
| 5,110,761 | 5/1992 | Kalfus et al. | 438/123 |
| 5,132,768 | 7/1992 | Jaecklin et al. | 257/689 |
| 5,218,231 | 6/1993 | Kudo | 257/727 |
| 5,245,412 | 9/1993 | Clark et al. | 257/723 |
| 5,581,095 | 12/1996 | Salbreux | 257/110 |

FOREIGN PATENT DOCUMENTS

| | | | |
|---|---|---|---|
| A-0 463 297 | 1/1992 | European Pat. Off. | H01L 21/60 |
| A-0 642 176 | 3/1995 | European Pat. Off. | H01L 29/87 |
| 5-33558 | 12/1993 | Japan | 257/109 |

OTHER PUBLICATIONS

French Search Report from French Patent Application No. 95 14382, filed Nov. 30, 1995.
Patent Abstracts of Japan vol. 005, No. 082 (E-059) May 29, 1981 & JP-A-56 029335 (NEC Corp.).
Patent Abstracts of Japan, vol. 009, No. 008 (E-289), Jan. 12, 1985 & JP-A-59 155162 (Fujitsu KK).

Primary Examiner—Tom Thomas
Assistant Examiner—Alexander Oscar Williams
Attorney, Agent, or Firm—Wolf, Greenfield & Sacks, P.C.

[57] ABSTRACT

A mesa-type semiconductor component including on at least one of its surfaces, in addition to a circumferential ring constituted by a portion of a passivating glass layer, at least one pad constituted by a portion of this layer and acting as a spacer.

15 Claims, 2 Drawing Sheets

5,796,123

1

SEMICONDUCTOR COMPONENT MOUNTED BY BRAZING

BACKGROUND OF THE INVENTION

1. Field of the Invention

The present invention relates generally to the field of mounting semiconductor components and, more specifically, to semiconductor components mounted by brazing.

2. Discussion of the Related Art

In the field of diode-type semiconductor components, assemblies of the type shown in FIG. 1 are often encountered, wherein a semiconductor chip 1 is mounted between two metallic members 3 and 4. Metallic members 3 and 4 may be, for example, two disks or other types of connection plates. The connection between chip 1 and conductors 3 and 4 is ensured by brazing layers 6.

It can be understood that it is quite a delicate task to perform this brazing operation while maintaining a substantially constant brazing thickness. Accordingly, several quite elaborate methods have been provided for this purpose.

FIG. 2A is a cross-sectional view of a mesa-type structure semiconductor chip. FIG. 2B is an enlarged cross-sectional view of the left portion of FIG. 2A. To form a mesa-type structure, grooves 7 are formed in a silicon wafer, after which the whole wafer, including the grooves, is coated with a passivating layer, commonly a glass 8, which is then etched to leave the glass 8 in the groove and to create a glass ring 9 at the chip circumference. After this and other operations, the chips are separated from one another, for example by sawing. In practical devices, the thickness of the passivating (or glassivating) ring 9 at the chip circumference currently is from 10 to 20 micrometers. Generally, it is desired to obtain a brazing layer with a thickness of 15 to 25 micrometers. The presence of ring 9 prevents connection member 3 and 4 from coming into contact with the surface or part of the surface of chip 1 during the brazing operations.

However, in some types of assemblies, the presence of this circumferential ring 9 is not sufficient to maintain separation between the connection members and the silicon surface. This is for example the case when, as illustrated in FIG. 3, one or the other of connection members 11, 12, has a lower cross-section area than the area defined by the internal circumference of passivating ring 9. Also, as shown in FIG. 4, when the connection surfaces are relatively thin metallic sheet elements, which are likely not to be planar, one or more points of one of the metallic sheet elements may come into contact with the silicon surface.

In practice, it has been found that the presence of a contact between a silicon chip and at least one point of a connection to this chip is likely to damage and cause a failure of the chip after repeated thermal stress. Further analysis has shown that this damage results from a cleavage of the silicon at the chip surface at the level of the contact point. This cleavage has been attributed to the rubbing between the connection member and the chip when placed under thermal stress due to differential expansions between the metal connection members, often copper, and the silicon.

SUMMARY OF THE INVENTION

The present invention aims at solving this problem and at avoiding the contact between a connection and a semiconductor chip brazed to this connection.

To achieve these objectives, the present invention provides a mesa-type semiconductor component including on at

2 least one of its surfaces, in addition to a circumferential ring formed by a portion of a passivating glass layer, at least one pad constituted by a portion of the glass layer and acting as a spacer.

According to an embodiment of the present invention, the component is a double Shockley diode.

According to another embodiment of the present invention, the component has a lateral dimension of from 1 to 3 mm.

According to another embodiment of the present invention, the pads are disposed relative to each other such that they are substantially at the apexes of an equilateral triangle centered on the center of the chip.

BRIEF DESCRIPTION OF THE DRAWINGS

These and other objects, features and advantages of the present invention will become apparent from the following description of specific embodiments of the present invention, given by way of example with reference to the following drawings, wherein.

DETAILED DESCRIPTION

Figure 1:
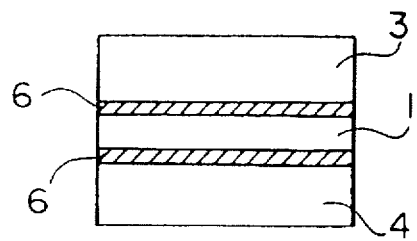
FIGS. 1 to 4 are schematic cross-sectional views of various structures of semiconductor chips brazed to various types of connection members.
Figure 2A:
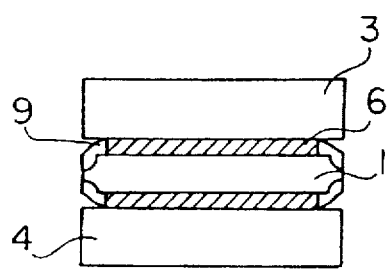
Figure 2B:
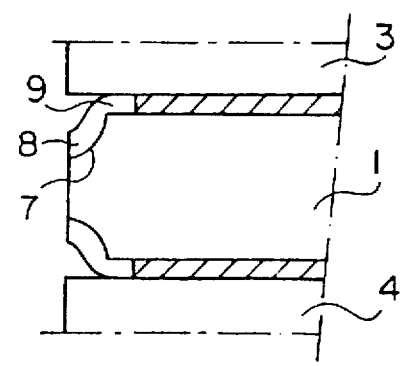
Figure 3:
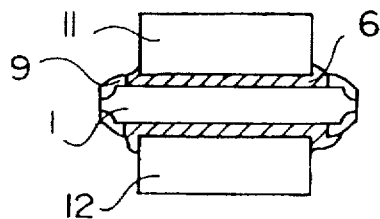
Figure 4:
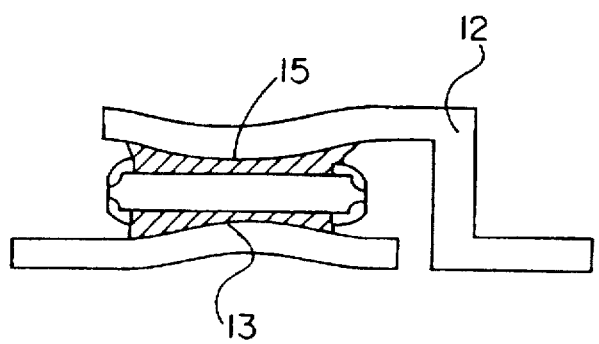
Figure 5A:
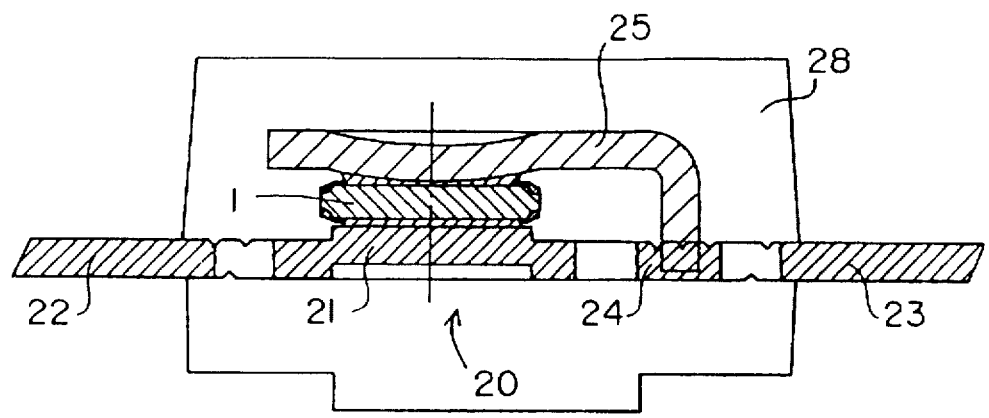
FIGS. 5A and 5B are a cross-sectional view and a plane view of an exemplary connection structure used according to a preferred embodiment of the present invention.
Figure 5B:
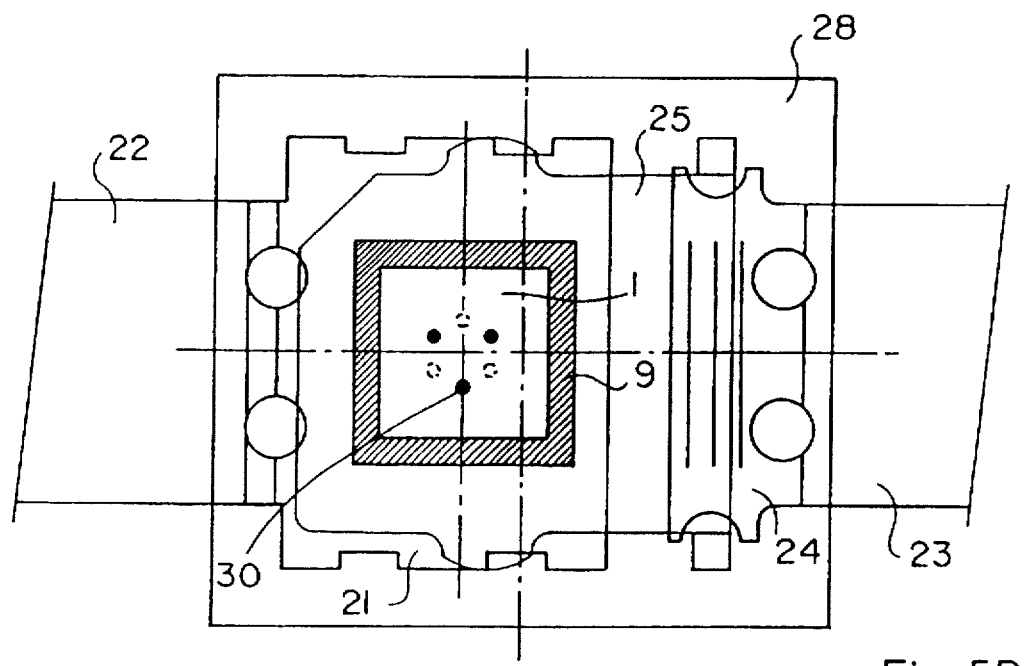

FIGS. 5A and 5B illustrate an exemplary assembly wherein the above-mentioned problem has been encountered. The assembly illustrated in FIGS. 5A and 5B is a high voltage protection component of the double Shockley diode type manufactured by SGS-Thomson Microelectronics (ST) under trade name Trisil. Silicon chip 1 is mounted on a base 21 of a connection grating 20. As is well known, a connection grating is a pre-cut conducting plate, some mechanical connections of which may be cut out after the mounting of the silicon chip to isolate various connections. Base 21 forms one piece with a first connection pin 22. A second connection pin 23 is separated from the base 21 after the mounting. This separation can be achieved, for example, by having the pin 23 cut out. A bridge 25 is welded on a portion 24 of the connection grating 20, forming one piece with connector 23. After brazing base 21 and bridge 25 to chip 1, the assembly is embedded in an encapsulating material 28.

It should be noted that bridge 25 is likely to have a curved shape with its convexity facing the chip 1 and that there thus exists a risk of contact between the chip 1 and a portion of the bridge 25.

Figure 6:
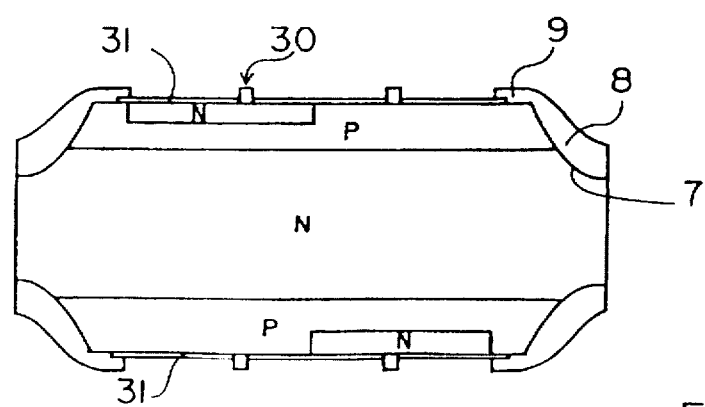
FIG. 6 is a schematic cross-sectional view of a high voltage protection component illustrating an exemplary implementation of the present invention.

FIG. 6 shows a schematic cross-sectional view of a preferred embodiment of a Trisil semiconductor component manufactured in accordance with the present invention. This component, preferably of the mesa type, includes at its circumference grooves 7 filled with a glass 8 which overflows to form a ring 9 at the upper and lower surfaces of the component.

The manufacturing of such a component begins with a semiconductor layer in which the various N- and P-type diffused layers required to form the component are first formed. Then, grooves are etched at the edges of each individual chip. The assembly is then coated with a protective glass layer (glassivation). The glass is, for example, spun on. The glass is then etched by, for example, masking and chemical etching, to leave the glass 8 in the grooves and the glass ring 9 at the circumference.

According to the present invention, the etching mask is configured to leave glass pads 30 in various selected locations on the surface of the component. These glass pads 30 are meant to act as spacers, preventing any contact between a connection member 21, 25 and the chip 1. These pads are, for example, disposed substantially at the apexes of an equilateral triangle centered on the center of the chip as shown in FIG. 5B.

As noted, the glassivation layer has a thickness of approximately 10 to 20 micrometers. The upcoming brazing has a thickness of approximately twenty micrometers, the glass pads are well adapted to perform the desired spacer function.

After forming and delimiting the glassivation layer by notably leaving pads 30, a metallization 31 of the surfaces of the component is performed. This metallization is, for example, performed by non-electrolytic deposition in order to only cover the semiconductor surfaces of the component and not the glass layers. Subsequently, the individual chips are cut out and mounted.

In order to better understand the structure of the high voltage protection component illustrated in FIG. 6 and the connection structure shown in FIGS. 5A and 5B, it is noted that in practice, such a component as a Trisil diode is a square chip with a side dimension of 1 to 3 mm. The drawings are thus very much enlarged.

The present invention is likely to have various alterations, modifications, and improvements which will occur to those skilled in the art. Notably, although it has been described in the context of a bipolar Trisil-type component, it applies to other components such as the components manufactured by SGS-Thomson Microelectronics under trade name Transil, as well as to components with three electrodes, two of which are main electrodes, such as thyristors or triacs. It can also be implemented on a single surface of a component.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalents thereto.

What is claimed is:

1. A mesa-type semiconductor component, comprising:
   a circumferential ring formed by glassivation on at least one of its surfaces; and
   at least one pad formed by said glassivation on said at least one of said surfaces, said at least one pad acting as a spacer configured to prevent a connection member from contacting said at least one of said surfaces.

2. The component according to claim 1, wherein the semiconductor component is a double Shockley diode.

3. The component according to claim 1, wherein the semiconductor component has a substantially square cross-section having side dimensions in the range of 1 to 3 mm.

4. The component according to claim 1, wherein the pads are disposed substantially at the apexes of an equilateral triangle centered on the center of said at least one surface of the component.

5. A semiconductor component, comprising:
   a silicon wafer having an upper surface, a lower surface, and side surfaces having grooves formed around the periphery of said wafer adjacent to said upper and lower surfaces;
   a passivating layer deposed on the periphery of said silicon wafer, said passivating layer filling said grooves and forming a ring around a circumference of said upper and lower surfaces of said wafer; and
   one or more spacer pads deposed at predetermined locations on one or more of said upper and lower surfaces of said silicon wafer, said one or more spacer pads configured to prevent a connection member from contacting said one or more of said upper and lower surfaces.

6. The semiconductor component according to claim 5, further comprising:
   a metalization layer deposed on said upper and lower surfaces of said silicon wafer, said metalization layer not covering said passivating layer and said one or more spacer pads.

7. The semiconductor component according to claim 5, wherein said one or more spacer pads are deposed substantially at the apexes of an equilateral triangle centered on said one or more surfaces of said silicon wafer.

8. The component according to claim 5, wherein said passivating layer is comprised of glass.

9. The component according to claim 5, wherein said one or more spacer pads are comprised of glass.

10. The component according to claim 8, wherein said one or more spacer pads are comprised of said glass of said passivating layer.

11. The component according to claim 5, wherein said passivating layer has a thickness ranging from 10 to 20 micrometers.

12. The semiconductor component according to claim 5, wherein the semiconductor component is a high voltage semiconductor device.

13. The semiconductor component according to claim 12, wherein the semiconductor component is a double Shockley diode.

14. The semiconductor component according to claim 5, wherein the semiconductor component is a mesa-type semiconductor component.

15. The semiconductor component according to claim 5, wherein the semiconductor component has a substantially square cross-section having side dimensions in the range of 1 to 3 mm.

* * * * *